(12) United States Patent
Lee et al.

(10) Patent No.: US 9,978,584 B2
(45) Date of Patent: May 22, 2018

(54) APPARATUS AND METHOD FOR TREATING SUBSTRATE

(71) Applicant: Semes Co., Ltd., Chungcheongnam-do (KR)

(72) Inventors: Young Hun Lee, Chungcheongnam-do (KR); Eui Sang Lim, Busan (KR); Min Jun Cho, Chungcheongnam-do (KR); Jae Myoung Lee, Chungcheongnam-do (KR)

(73) Assignee: SEMES CO., LTD., Seoul (KR)

( * ) Notice: Subject to any disclaimer, the term of this patent is extended or adjusted under 35 U.S.C. 154(b) by 0 days. days.

(21) Appl. No.: 15/251,760

(22) Filed: Aug. 30, 2016

(65) Prior Publication Data

US 2018/0012755 A1 Jan. 11, 2018

(30) Foreign Application Priority Data

Jul. 11, 2016 (KR) ........................ 10-2016-0087437

(51) Int. Cl.
*H01L 21/02* (2006.01)
*H01L 21/67* (2006.01)
*H01L 21/306* (2006.01)
*B08B 7/00* (2006.01)
*F26B 21/10* (2006.01)
*F26B 21/06* (2006.01)

(52) U.S. Cl.
CPC ...... *H01L 21/02101* (2013.01); *B08B 7/0021* (2013.01); *F26B 21/06* (2013.01); *F26B 21/10* (2013.01); *H01L 21/02046* (2013.01); *H01L 21/30604* (2013.01); *H01L 21/67017* (2013.01); *H01L 21/67028* (2013.01); *H01L 21/67034* (2013.01); *H01L 21/67069* (2013.01)

(58) Field of Classification Search
None
See application file for complete search history.

(56) References Cited

U.S. PATENT DOCUMENTS

2015/0155188 A1* 6/2015 Jung ................. H01L 21/67034
216/59

FOREIGN PATENT DOCUMENTS

| JP | 2012049446 | 3/2012 |
|---|---|---|
| KR | 10-2007-0076992 A | 7/2007 |
| KR | 100744145 | 7/2007 |
| KR | 101074460 | 10/2011 |
| KR | 101513581 | 10/2011 |
| KR | 1020120008134 | 1/2012 |
| KR | 1020120041014 | 4/2012 |
| KR | 10-2013-0134993 A | 12/2013 |

(Continued)

*Primary Examiner* — Jiong-Ping Lu
(74) *Attorney, Agent, or Firm* — Jenkins, Wilson, Taylor & Hunt, P.A.

(57) ABSTRACT

A method for treating a substrate, in which a supercritical fluid is supplied into a chamber, in which the substrate is carried, to treat the substrate, the method including a supply step of supplying the supercritical fluid into the chamber until a pressure of the interior of the chamber reaches a preset pressure, and a substrate treating step of performing a supercritical process while repeating supply and exhaust of the supercritical fluid into and out of the interior of the chamber after the supply step, wherein a flow rate of the supercritical fluid supplied into the chamber in the supply step is variable.

12 Claims, 15 Drawing Sheets

(56) References Cited

FOREIGN PATENT DOCUMENTS

| KR | 10-2013-0138122 A | 12/2013 |
|----|-------------------|---------|
| KR | 10-2015-0008404 A | 1/2015  |
| KR | 101590906         | 6/2015  |

* cited by examiner

Prior Art

APPARATUS AND METHOD FOR TREATING SUBSTRATE

CROSS-REFERENCE TO RELATED APPLICATIONS

This application claims priority under 35 U.S.C. § 119 to Korean Patent Application No. 10-2016-0087437 filed Jul. 11, 2016 in the Korean Intellectual Property Office, the entire contents of which are hereby incorporated by reference herein.

BACKGROUND

The inventive concept relates to an apparatus and a method for treating a substrate, and more particularly, to an apparatus and a method for drying a substrate.

In general, a semiconductor device is formed through various processes, such as a photo process, an etching process, an ion implantation process, and a deposition process, on a substrate such as a silicon wafer.

Further, in the processes, various foreign substances such as particles, organic contaminants, metal impurities are produced. Because the foreign substances cause defects and directly influence the performance and yield rate of the semiconductor device, the semiconductor manufacturing process is essentially accompanied by a cleaning process for removing the foreign substances.

The cleaning process includes a chemical processing process of removing contaminants from a substrate with a chemical, a wet cleaning process of removing the chemical residing on the substrate with pure water, and a drying process for drying the pure water residing on a surface of the substrate by supplying a drying fluid.

In the part, the drying process was performed by supplying heated nitrogen gas onto a substrate on which pure water is left. However, as the line width of a pattern formed on the substrate becomes smaller and the aspect ratio of the pattern becomes larger, pure water between patterns is not well removed. To achieve this, in recent years, pure water has been substituted on a substrate by a liquefied organic solvent, such as isopropyl alcohol, which is volatile and has a low surface tension as compared with pure water, and then a substrate has been dried by supplying heated nitrogen gas.

However, because the organic solvent that is nonpolar and pure water that is polar are not easily mixed, a large amount of organic solvent should be supplied for a long time to substitute pure water with the liquefied organic solvent.

The conventional drying process has been performed in a method of substituting pure water on a substrate with an organic solvent, such as isopropyl alcohol, which has a relatively low surface tension.

However, because the drying method still causes a pattern collapse for a semiconductor having a fine circuit pattern having a line width of 30 nm or less even when an organic solvent is used, a supercritical drying process that overcomes the problems has recently replaced the existing drying processes.

The drying process includes a supply step of supplying a supercritical fluid to a chamber, a step of treating a substrate while repeatedly supply and exhausting the supercritical fluid in a specific internal pressure range of the chamber, and an exhaust step of exhausting the supercritical fluid that has treated the substrate.

In the supply step of supplying the supercritical fluid to the chamber, the supercritical fluid is supplied at an initial state, and the supercritical fluid is supplied at a high flow rate if the internal pressure of the chamber reaches a preset pressure. However, much time is necessary to sufficiently fill the supercritical fluid in the chamber if the supercritical fluid is supplied at a low flow rate in the initial supply stage. Accordingly, unnecessary time is consumed in a preparation process of treating the substrate. Further, as a result, because time for drying the substrate is delayed, process efficiency deteriorates.

SUMMARY

The inventive concept provides a substrate treating apparatus that may shorten a substrate drying time by promptly supplying a supercritical fluid into a chamber, thereby improving process efficiency.

Problems that are solved by the inventive concept are not limited to the above-mentioned problems, and the unmentioned problems will be clearly understood by those skilled in the art to which the inventive concept pertains from the specification and the accompanying drawings.

The inventive concept provides an apparatus and method for treating a substrate.

According to an embodiment, there is provided a method for treating a substrate, in which a supercritical fluid is supplied into a chamber, in which the substrate is carried, to treat the substrate, the method including a supply step of supplying the supercritical fluid into the chamber until a pressure of the interior of the chamber reaches a preset pressure, and a substrate treating step of performing a supercritical process while repeating supply and exhaust of the supercritical fluid into and out of the interior of the chamber after the supply step, wherein a flow rate of the supercritical fluid supplied into the chamber in the supply step is variable.

According to an embodiment, the flow rate of the supercritical fluid supplied in the supply step may be varied by one or more fixing control lines that are provided with orifices having different opening sizes.

According to an embodiment, the flow rate of the supercritical fluid supplied in the supply step may be varied by a variable control line provided with a valve that is connected in parallel to the fixed control line to control flow rate and the fixed control line.

According to an embodiment, the flow rate of the supercritical fluid supplied in the supply step may be varied by a regulator that is provided on a supply line through which the supercritical fluid is supplied.

According to an embodiment, the supply step may include a first supply step of supplying the supercritical fluid into the chamber until a pressure of the interior of the chamber reaches a first preset pressure, and a second supply step of supplying the supercritical fluid into the interior of the chamber until the pressure of the interior of the chamber reaches a second preset pressure after the first supply step, and a first flow rate of the supercritical fluid supplied in the first supply step may be higher than a second flow rate of the supercritical fluid supplied in the second supply step.

According to an embodiment, at least one of the first flow rate and the second flow rate may vary over time.

According to an embodiment, the first preset pressure may be a critical pressure of the supercritical fluid.

According to an embodiment, the supercritical fluid may be carbon dioxide, and the first preset pressure may be 100 bar to 120 bar.

The inventive concept provides an apparatus for treating a substrate.

According to an embodiment, there is provided an apparatus for treating a substrate, the apparatus including a chamber that provides a space for processing a substrate, a supply line that supplies the supercritical fluid into the chamber, a flow rate control unit that varies a flow rate of the supplied supercritical fluid, and a controller that controls the flow rate control unit, wherein the controller controls the flow rate control unit such that the supercritical fluid is supplied at a first flow rate until a pressure of the interior of the chamber reaches a first preset pressure and the supercritical fluid is supplied at a second flow rate that is lower than the first flow rate until the pressure of the interior of the chamber reaches a second preset pressure after the pressure of the interior of the chamber reaches the first preset pressure.

According to an embodiment, the flow rate control unit may include one or more fixed control lines that are branched out from the supply line to be connected in parallel to each other such that the supercritical fluid flows through the one or more fixed control lines, and the fixed control lines are provided with orifices having openings through which a fluid flows, the sizes of the openings being different.

According to an embodiment, the flow rate control unit may include a variable control line that is branched out from the supply line to be connected in parallel to the fixed control lines such that the supercritical fluid flows through the variable control line, and the variable control line is provided with a flow rate control valve that controls a flow rate of the supercritical fluid.

According to an embodiment, the flow rate control unit may include a regulator that is provided on the supply line to control a flow rate of the supplied supercritical fluid.

According to an embodiment, the controller may control the regulator such that at least one of the first flow rate and the second flow rate varies over time.

According to an embodiment, the first preset pressure may be a critical pressure of the supercritical fluid.

According to an embodiment, the supercritical fluid may be carbon dioxide, and the first preset pressure may be 100 bar to 120 bar.

BRIEF DESCRIPTION OF THE DRAWINGS

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

Hereinafter, a substrate processing apparatus 100 (see FIG. 2) according to the inventive concept will be described.

The substrate processing apparatus 100 may perform a supercritical process of processing a substrate by using a supercritical fluid as a process fluid.

Here, the substrate is an inclusive concept including a semiconductor device or a flat panel display (FPD), and other substrates used for manufacturing objects in which a circuit pattern is formed on a thin film. Examples of such substrates include various wafers including a silicon wafer, glass substrates, and organic substrates.

A supercritical fluid refers to a phase having properties of both a gas and a liquid that is obtained if a fluid reaches a supercritical state in which a supercritical temperature and a supercritical pressure are exceeded. The molecular density of the supercritical fluid is close to that of a liquid and the viscosity of the supercritical fluid is close to that of a gas, and accordingly, the supercritical fluid has an excellent diffusion force, an excellent penetration force, and an excellent dissolving force, which are advantageous in chemical reactions, and has a very low surface tension so that an interfacial tension is not applied to a fine structure.

A supercritical process is performed by using the characteristics of the supercritical fluid, and representative examples of such a supercritical process include a supercritical drying process and a supercritical etching process. Hereinafter, a supercritical drying process as a supercritical process will be described. However, because the description of the supercritical drying process is merely for convenience of description, the substrate processing apparatus 100 may perform a supercritical process other than the supercritical drying process.

The supercritical drying process may be performed by drying a substrate by dissolving an organic solvent residing in a circuit pattern of the substrate with a supercritical fluid, and has an excellent drying efficiency and prevents a collapse. The supercritical fluid used for the supercritical drying process may be a material that is miscible with an organic solvent. For example, a supercritical carbon dioxide ($scCO_2$) may be used as a supercritical fluid.

Figure 1:
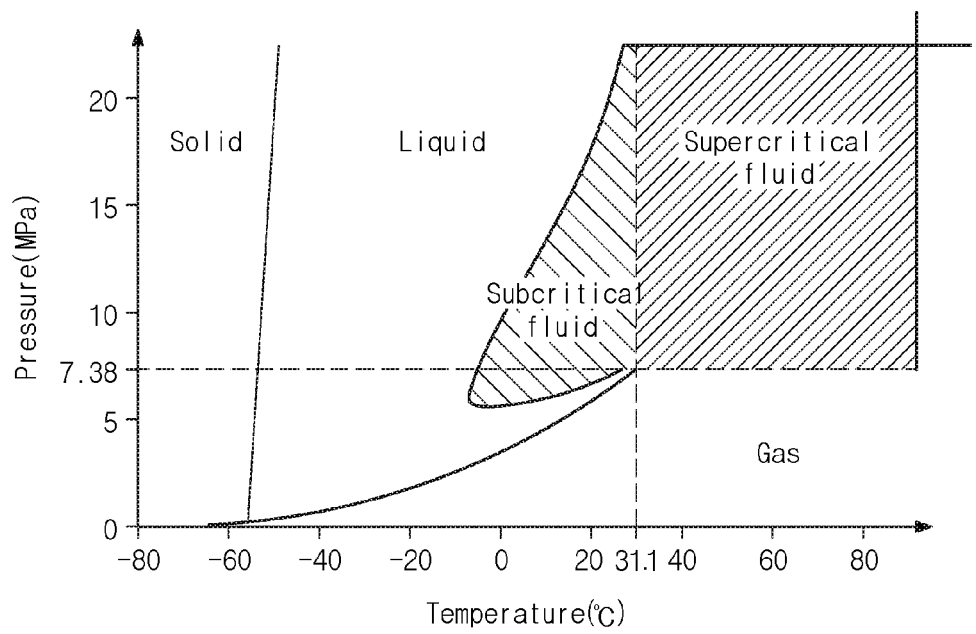
FIG. 1 is a graph depicting a phase change of carbon dioxide.

FIG. 1 is a graph depicting a phase change of carbon dioxide.

Carbon dioxide has a critical temperature of 31.1° C. and a critical pressure of 7.38 MPa, which are relatively low, so that it is easily converted into a supercritical state, a phase change of carbon dioxide is easily controlled by adjusting temperature and pressure, and the price of carbon dioxide is low. Further, carbon dioxide is nontoxic and is not harmful to the human bodies, and has inflammable and inactive characteristics, the supercritical carbon dioxide has a diffusion coefficient that is 10 to 100 times as high as those of water or other organic solvents so that the supercritical carbon dioxide penetrates fast and the organic solvent is rapidly substituted and has a very low surface tension so that it has properties that are advantageously used for drying a substrate having a fine circuit pattern. In addition, carbon dioxide may recycle side-products of various chemical reactions, and may be used in a supercritical drying process and then may be converted into a gaseous state to be reused after separating an organic solvent therefrom, which reduces a burden in an aspect of environmental contaminations.

Hereinafter, an embodiment of the substrate treating apparatus 100 will be described. The substrate treating apparatus 100 may perform a cleaning process including the supercritical drying process according to an embodiment of the inventive concept.

Figure 2:
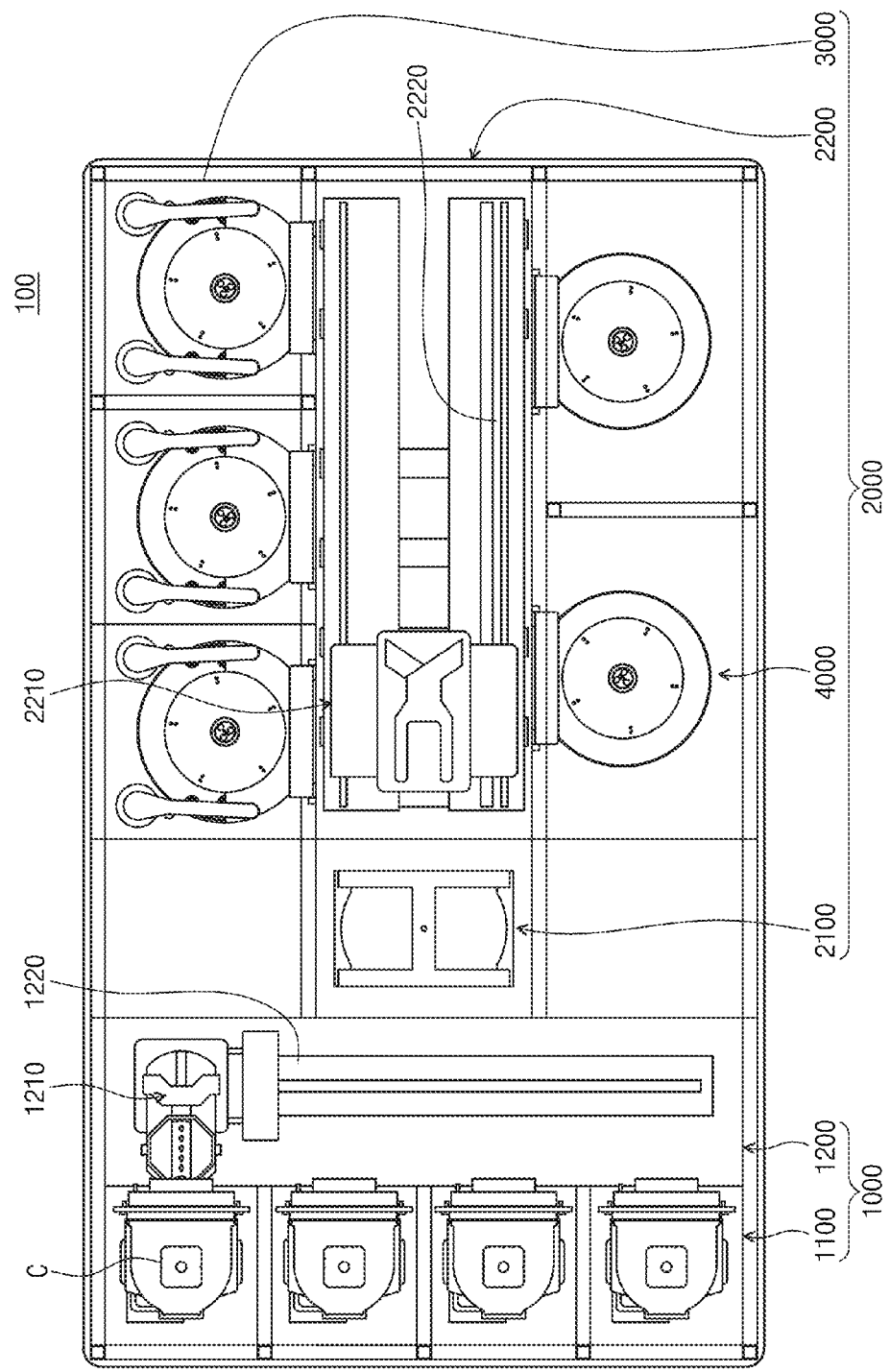
FIG. 2 is a plan view of an embodiment of a substrate treating apparatus.

FIG. 2 is a plan view of an embodiment of a substrate treating apparatus.

Referring to FIG. 2, the substrate treating apparatus 100 includes an index module 1000 and a process module 2000.

The index module 1000 may receive the substrate from the outside and transports the substrate to the process module 2000, and the process module 2000 may perform a supercritical drying process.

The index module 1000 is an equipment front end module (EFEM), and includes a load port 1100 and a feeding frame 1200.

A container C in which the substrate is accommodated is positioned on the load port 1100. A front opening unified pod (FOUP) may be used as the container C. The container C may be carried into the load port 1100 from the outside by an overhead transfer, or may be carried out of the load port 1100.

The feeding frame 1200 transports the substrate between the container C positioned on the load port 1100 and the process module 2000. The feeding frame 1200 includes an index robot 1210 and an index rail 1220. The index robot 1210 may transport the substrate while moving on the index rail 1220.

The process module 2000 is a module for actually performing a process, and includes a buffer chamber 2100, a feeding chamber 2200, a cleaning chamber 3000, and a second cleaning chamber 4000.

The buffer chamber 2100 provides a space in which the substrate transported between the index module 1000 and the process module 200 temporarily stays. A buffer slot, in which the substrate is positioned, may be provided in the buffer chamber 2100.

The feeding chamber 2200 transports a substrate between the buffer chamber 2100, the cleaning chamber 3000, and the chamber 4000 arranged around the feeding chamber 2200. The feeding chamber 2200 may include a feeding robot 2210 and a feeding rail 2220. The feeding robot 2210 may transport the substrate while moving on the feeding rail 2220.

The cleaning chamber 3000 and the chamber 4000 may perform a cleaning process. Then, the cleaning process may be sequentially performed between the cleaning chamber 3000 and the chamber 4000. For example, the cleaning chamber 3000 may perform, among the cleaning process, a chemical process, a rinsing process, and an organic solvent process, and subsequently, the chamber 4000 may perform a supercritical drying process.

The cleaning chamber 3000 and the chamber 4000 are arranged on a side surface of the feeding chamber 2200. For example, the cleaning chamber 3000 and the chamber 4000 are disposed on different side surfaces of the feeding chamber 2200 to be opposite to each other.

Further, the process module 2000 may include a plurality of cleaning chambers 3000 and a plurality of chambers 4000. The plurality of process chambers 3000 and 4000 may be disposed in a row on a side surface of the feeding chamber 2200, may be disposed to be stacked on one another, or may be disposed through a combination thereof.

Of course, the disposition of the cleaning chamber 3000 and the chamber 4000 is not limited to the aforementioned example, and may be properly changed in consideration of various elements such as a footprint or a process efficiency of the substrate treating apparatus 100.

Figure 3:
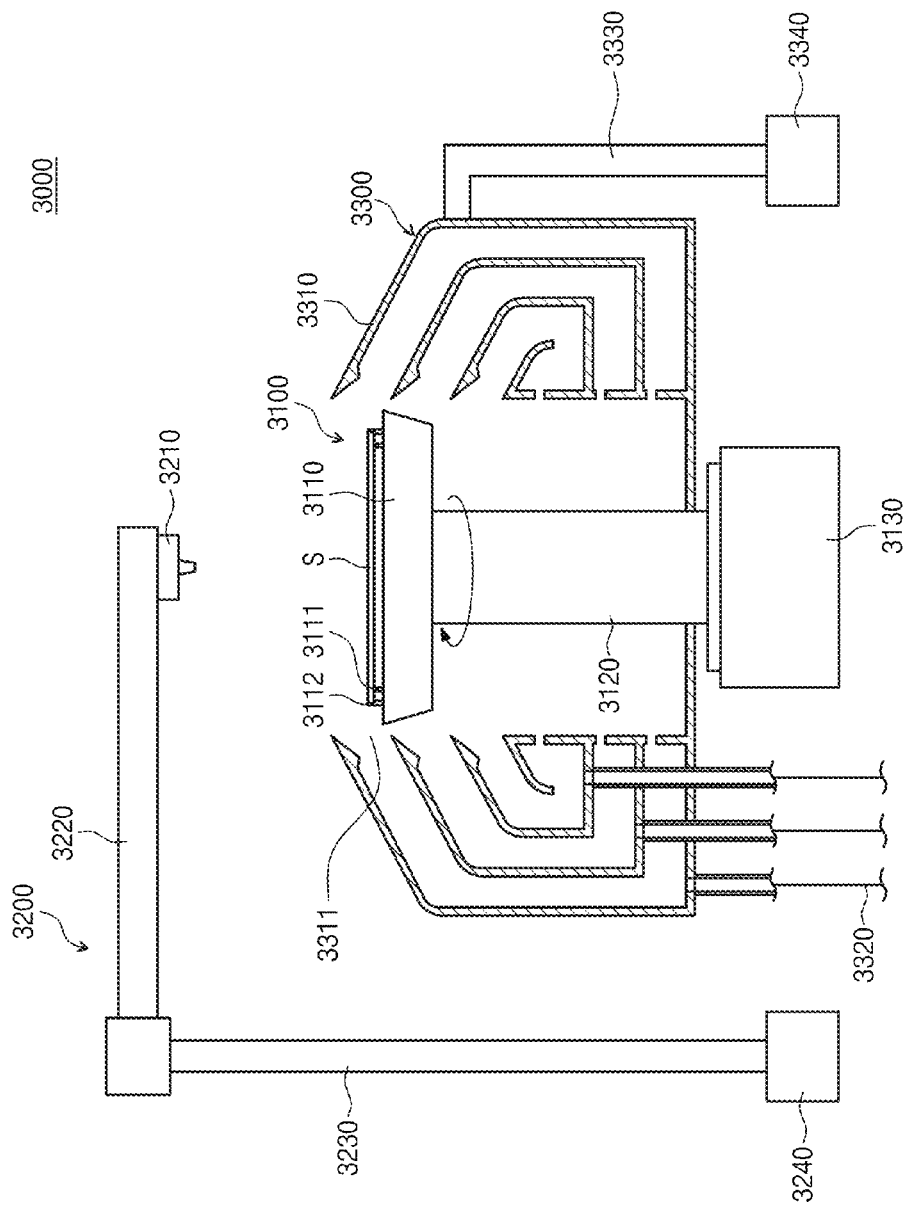
FIG. 3 is a sectional view illustrating a cleaning chamber of FIG. 2.

Hereinafter, the cleaning chamber 3000 will be described. FIG. 3 is a sectional view illustrating a cleaning chamber of FIG. 2;

The cleaning chamber 3000 may perform a chemical process, a rinsing process, and an organic solvent process. Of course, the cleaning chamber 3000 may selectively perform some of the processes. Here, the chemical process is a process of removing foreign substances on a substrate by providing a cleaning agent to the substrate, the rinsing process is a process of washing the cleaning agent residing on the substrate by providing a rinsing agent to the substrate, and an organic solvent process is a process of substituting the rising agent residing between circuit patterns of the substrate with an organic solvent having a low surface tension by providing the organic solvent to the substrate.

Referring to FIG. 3, the cleaning chamber 3000 includes a support member 3100, a nozzle member 3200, and a recovery member 3300.

The support member 3100 may support the substrate, and may rotate the supported substrate. The support member 3100 may include a support plate 3110, a support pin 3111, a chucking pin 3112, a rotary shaft 3120, and a rotation driver 3130.

The support plate 3110 has an upper surface that is the same as or similar to the substrate, and the support pin 3111 and the chucking pin 3112 are formed on the upper surface of the support plate 3110. The support pin 3111 may support the substrate, and the chucking pin 3112 may fix the supported substrate.

The rotary shaft 3120 is connected to a lower portion of the support plate 3110. The rotary shaft 3120 receives a rotational force from the rotation driver 3130 and rotates the support plate 3110. Accordingly, the substrate seated on the support plate 3110 may be rotated. Accordingly, the chucking pin 3112 may prevent the substrate from deviating from a proper position.

The nozzle member 3200 ejects a chemical to the substrate. The nozzle member 3200 includes a nozzle 3210, a nozzle bar 3220, a nozzle shaft 3230, and a nozzle shaft driver 3240.

The nozzle 3210 ejects a chemical to the substrate seated on the support plate 3110. The chemical may be a cleaning agent, a rinsing agent, and an organic solvent. Here, the cleaning agent may include a hydrogen peroxide ($H_2O_2$) solution, a solution in which ammonia ($NH_4OH$), hydrochloric acid (HCl), or sulfuric acid ($H_2SO_4$) is mixed with a hydrogen peroxide acid solution, or a hydrofluoric acid (HF) solution. Further, pure water may be used as the rinsing agent. A solution or a gas of ethyl glycol, 1-propanol, tetra hydraulic franc, 4-hydroxyl, 4-methyl, 2-pentanone, 1-butanol, 2-butanol, methanol, ethanol, n-propyl alcohol, or dimethyl ether, including isopropyl alcohol, may be used as the organic solvent.

The nozzle 3210 is formed on the bottom surface of one end of the nozzle bar 3220. The nozzle bar 3220 is coupled to the nozzle shaft 3230, and the nozzle shaft 3230 is provided to be elevated or rotated. The nozzle shaft driver 3240 may adjust the location of the nozzle 3210 by elevating or rotating the nozzle shaft 3230.

The recovery member 3300 recovers the chemical supplied to the substrate. If the chemical is supplied to the substrate by the nozzle member 3200, the support member 3100 may uniformly supply the chemical to the entire area of the substrate by rotating the substrate. If the substrate is rotated, the chemical is spattered from the substrate, and the spattered chemical may be recovered by the recovery member 3300.

The recovery member 3300 may include a recovery vessel 3310, a recovery line 3320, an elevation bar 3330, and an elevation driver 3340.

The recovery vessel 3310 is provided to have an annular ring shape that surrounds the support plate 3110. A plurality of recovery vessels 3310 may be provided, and the plurality of recovery vessels 3310 are provided to have ring shapes that become sequentially more distant from the support plate 3110 when viewed from the top, and the heights of the recovery vessels 3310 become larger as the recovery vessels 3310 become more distant from the support plate 3110. Accordingly, a recovery hole 3311 through which the chemical spattered from the substrate is formed in a space between the recovery vessels 3310.

A recovery line 3320 is formed on the lower surface of the recovery vessel 3310. The recovery line 3320 supplies the chemical to a chemical recycling system (not illustrated) that recycles a chemical recovered by the recovery vessel 3310.

The elevation bar 3330 is connected to the recovery vessel 3310, and receives power from the elevation driver 3340 and moves the recovery vessel 3310 upwards and downwards. When a plurality of recovery vessels 3310 are provided, the elevation bar 3330 may be connected to the outermost recovery vessel 3310. The elevation driver 3340 may adjust a recover hole 3311, through which the spattered chemical is spattered, from a plurality of recovery holes 3311 by elevating the recovery vessels 3310 through the elevation bar 3330.

Hereinafter, the substrate treating apparatus 200 that treats a substrate by using a supercritical fluid will be described according to an embodiment of the inventive concept.

Figure 5:
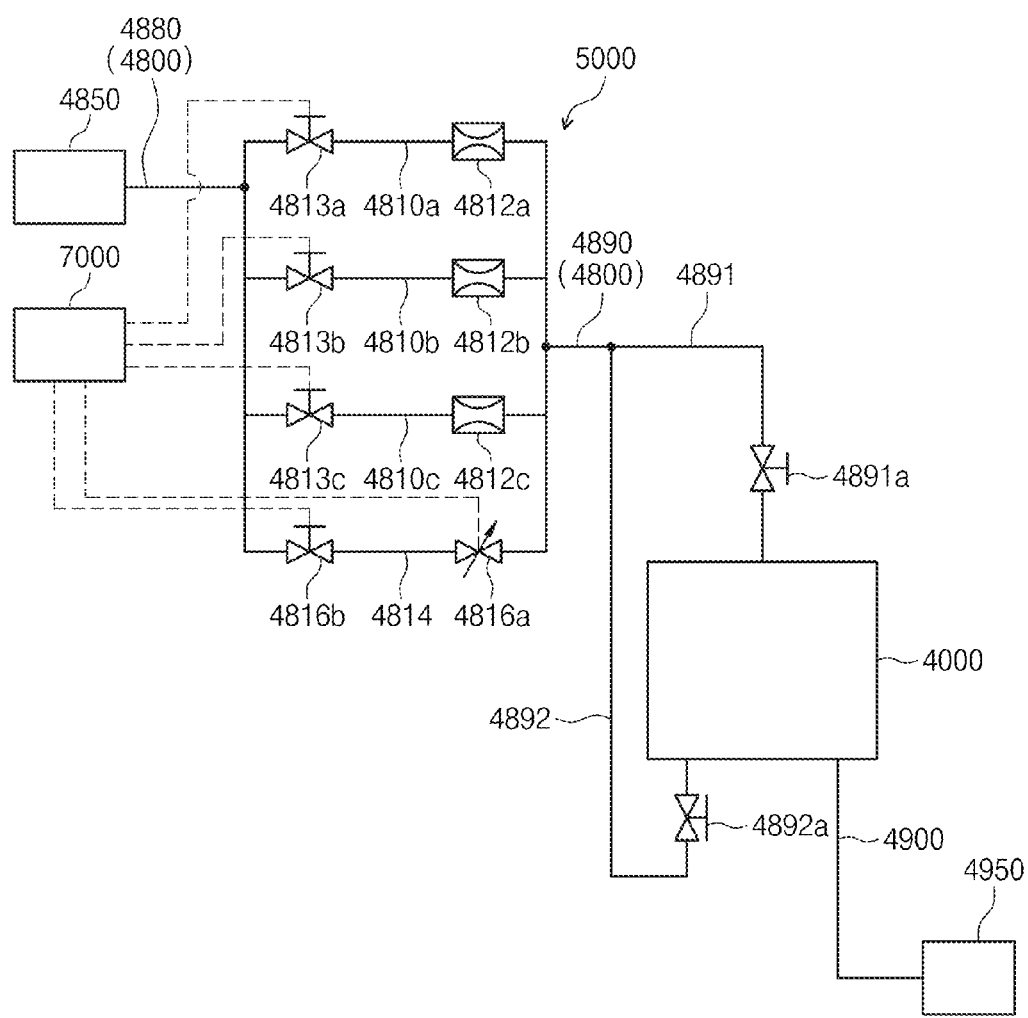
FIG. 5 is a view illustrating a first embodiment of the substrate treating apparatus of FIG. 2.

FIG. 5 is a view illustrating a first embodiment of the substrate treating apparatus. Referring to FIG. 5, the substrate treating apparatus 200 includes a chamber 400, a supply tank 4850, a supply line 4800, a flow rate control unit 5000, an exhaust line 4900, and a controller 7000.

Figure 4:
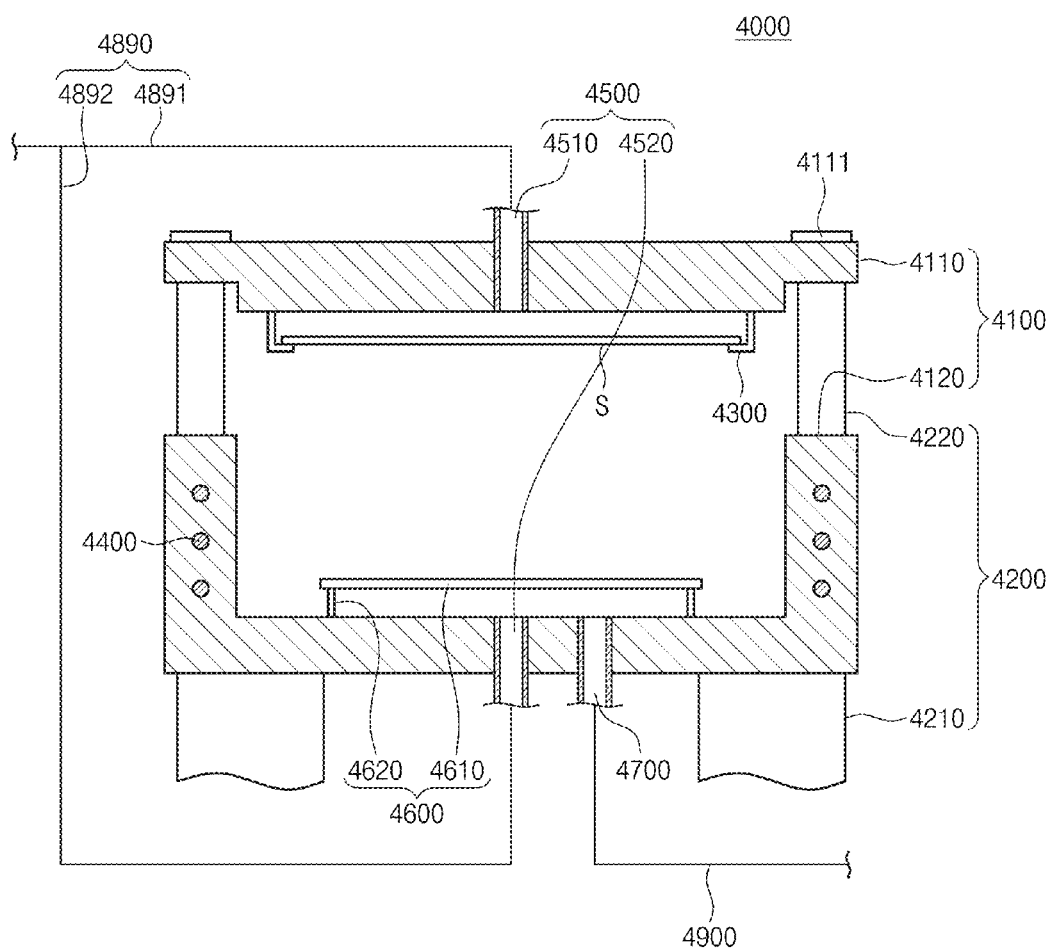
FIG. 4 is a sectional view of an embodiment of a chamber of FIG. 2.

FIG. 4 is a sectional view of an embodiment of a chamber 4000 of FIG. 2. Referring to FIG. 4, the chamber 4000 may include a housing 4100, an elevation member 4200, a support member 4300, a heating member 4400, a supply port 4500, a blocking member 4600, and an exhaust port 4700.

The chamber 4000 may perform a supercritical drying process by using a supercritical fluid. Of course, the process performed in the chamber 4000 may be a supercritical process other than the supercritical drying process, and moreover, the chamber 4000 may perform a process by using a process fluid other than the supercritical fluid.

The housing 4100 provides a space in which the supercritical drying process is performed. The housing 4100 is formed of a material that endures a high pressure of more than a critical pressure.

The housing 4100 has an upper housing 4110 and a lower housing 4120 disposed below the upper housing 4110, which are vertically arranged.

The upper housing 4110 is fixedly installed, and the lower housing 4120 may be elevated. If the lower housing 4120 is lowered to be spaced apart from the upper housing 4110, an interior space of the chamber 4000 is opened and the substrate may be carried into the interior space of the chamber 4000 or may be carried out of the interior space of the chamber 4000. Here, the substrate carried into the chamber 4000 may be in a state in which an organic solvent resides after the organic solvent process in the cleaning chamber 3000. Further, if the lower housing 4120 is lifted to be attached to the upper housing 4110, the interior space of the chamber 4000 may be closed and a supercritical drying process may be performed in the interior of the chamber 4000.

The elevation member 4200 elevates the lower housing 4120. The elevation member 4200 may include an elevation cylinder 4210 and an elevation rod 4220. The elevation cylinder 4210 is coupled to the lower housing 4120 to generate a vertical driving force, that is, an elevational force. One end of the elevation rod 4220 is inserted into the elevation cylinder 4210 and extends vertically upwards, and an opposite end of the elevation rod 4220 is coupled to the upper housing 4110. If a driving force is generated in the elevation cylinder 4210 according to the construction, the elevation cylinder 4210 and the elevation rod 4220 may be relatively elevated, and the lower housing 4120 coupled to the elevation cylinder 4210 also may be elevated.

The support member 4300 supports the substrate between the upper housing 4110 and the lower housing 4120. The support member 4300 may be installed on the lower surface of the upper housing 4110 to extend vertically downwards, and a lower end of the support member 4300 may be bent perpendicularly in a horizontal direction.

A horizontality adjusting member 4111 may be installed in the upper housing 4110 in which the support member 4300 is installed. The horizontality adjusting member 4111 adjusts the horizontality of the upper housing 4110. If the horizontality of the upper housing 4110 is adjusted, the horizontality of the substrate seated on the support member 4300 installed in the upper housing 4111 may be adjusted. If the substrate is inclined in the supercritical drying process, the organic solvent flows along the inclined surface such that a specific portion of the substrate is not dried or is over-dried so that the substrate may be damaged. The horizontality adjusting member 4111 may adjust the horizontality of the substrate, thereby preventing the problem.

The heating member 4400 heats the interior of the chamber 4000. The heating member 4400 heats the supercritical fluid supplied into the chamber 4000 to a critical temperature or higher to maintain the supercritical fluid in a supercritical fluid phase or convert the liquefied supercritical fluid into a supercritical fluid again. The heating member 4400 may be buried and installed in at least one wall of the upper housing 4110 and the lower housing 4120. For example, the heating member 4400 may be a heater that receives electric power from the outside and generates heat.

The supply port 4500 supplies a supercritical fluid to the chamber 4000. The supply port 4500 may include an upper supply port 4510 and a lower supply port 4520. The upper supply port 4510 is formed in the upper housing 4110, and supplies a supercritical fluid onto the upper surface of the substrate supported by the support member 4300. The lower supply port 4520 is formed in the lower housing 4120, and supplies a supercritical fluid onto the lower surface of the substrate supported by the support member 4300.

As for the upper supply port 4510 and the lower supply port 4520, the lower supply port 4520 may supply a supercritical fluid first, and the upper supply port 4510 may supply the supercritical fluid later.

The blocking member 4600 blocks a supercritical fluid supplied through the supply port 4500 from being directly ejected onto the substrate. The blocking member 4600 may include a blocking plate 4610 and a support 4620. When the supercritical fluid is supplied through the lower supply port 4520 at an initial stage of the supercritical drying process, the internal pressure of the housing 4500 is low and thus the supplied supercritical fluid may be ejected at a high speed. If the supercritical fluid ejected at a high speed directly reaches the substrate, a portion of the substrate, to which the supercritical fluid is directly ejected, may be bent by a physical pressure of the supercritical fluid, generating a leaning phenomenon. Further, the substrate is fluctuated by an injection force of the supercritical fluid such that the organic solvent residing on the substrate flows so that the circuit patterns may be damaged. Accordingly, the blocking plate 4610 disposed between the lower supply port 4520 and the support member 4300 may block the supercritical fluid from being directly ejected onto the substrate, thereby preventing the substrate from being damaged by a physical force of the supercritical fluid.

The exhaust port 4700 exhausts the supercritical fluid from the chamber 4000. The exhaust port 4700 may be formed in the lower housing 4120. At an late stage of the supercritical drying process, the supercritical fluid may be exhausted from the chamber 4000 so that the internal pressure of the chamber 4000 may be reduced to a critical pressure or low and the supercritical fluid may be liquefied. The liquefied supercritical fluid may be discharged by the gravitational force through the exhaust port 4700 formed in the lower housing 4120.

FIG. 5 is a view illustrating a first embodiment of the substrate treating apparatus. Referring to FIG. 5, the supply tank 4850 stores a process fluid, which is to be supplied to the chamber 4000. The process fluid may be the above-described fluid in a supercritical state. For example, the process fluid may be carbon dioxide in a state of a pressure of 70 to 200 bar and a temperature of 30 to 90 degrees C.

The supply line 4800 supplies the process fluid in a supercritical state from the supply tank 4850 to the chamber 4000. The supply line 4800 includes a front supply line 4880 and a rear supply line 4890.

The front supply line 4880 moves the supercritical fluid from the supply tank 4850 to the flow rate control unit 5000. One end of the front supply line 4880 is connected to the supply tank 4850. An opposite end of the front supply line 4880 is connected to the flow rate control unit 5000. The supercritical fluid is moved from the supply tank 4850 to the flow rate control unit 5000 through the front supply line 4880.

The rear supply line 4890 supplies the supercritical fluid moved from the flow rate control unit 5000 to the chamber 4000. The rear supply line 4890 is connected to the flow rate control unit 5000. The supercritical fluid that has passed through the front supply line 4880 and the flow rate control unit 5000 is moved to the rear supply line 4890.

The rear supply line 4890 includes a first rear supply line 4891 and a second rear supply line 4892. The first rear supply line 4891 is connected to an upper portion of the chamber 4000. The second rear supply line 4892 is connected to a lower portion of the chamber 4000. Valves 4891a and 4892b are installed in the rear supply lines 4891 and 4892, respectively. The valves 4891a and 4892a may be opened and closed such that the supply of the supercritical fluid to the upper portion and the lower portion of the chamber 4000 may be controlled.

According to an embodiment, when the substrate is situated on the upper side of the interior of the chamber 4000, the supercritical fluid is supplied to a lower portion of the chamber 4000 through the second rear supply line 4892. This is because the supercritical fluid can be supplied to the lower supply port 4520 that is distant from the substrate so that damage to the substrate by an initial pressure can be prevented. Further, as described above, because an interruption member 4600 is provided at a lower portion of the chamber 4000, damage to the substrate due to the supply of the supercritical fluid can be prevented.

The flow rate control unit 5000 controls the flow rate of the supercritical fluid that is moved from the supply tank 4850 to the chamber 4000. According to a process time or a process step, the flow rate of the supercritical fluid supplied to the chamber 4000 may become different. This will be described later.

One end of the flow rate control unit 5000 is connected to the front supply line 4880. An opposite end of the flow rate control unit 5000 is connected to the rear supply line 4890. The flow rate control unit 5000 may include a fixed control line 4810 and a variable control line 4814.

The fixed control line 4810 is branched out from the front supply line 4880 and is connected to the rear supply line 4890. One or more fixed control lines 4810 may be provided. When a plurality of fixed control lines 4810 are provided, fixed control lines 4810a, 4810b, and 4810c may be connected in parallel to each other. The fixed control line 4810 may be provided with an opening/closing valve 4813 that may control a flow of the supercritical fluid. An orifice 4812 having an opening through which the supercritical fluid may flow is provided in the fixed control line 4810. When a plurality of fixed control lines 4810 are provided, the opening/closing valve 4813 and the orifice 4812 are provided in each of the fixed control lines 4810.

FIG. 5 illustrates a case in which three fixed control lines 4810 are provided. An example of the inventive concept will be described with reference to FIG. 5. Opening/closing valves 4813a, 4813b, and 4813c are provided in the fixed control lines 4810a, 4810b, and 4810c, respectively. Further, the sizes of the openings of the orifices 4812a, 4812b, and 4812c provided in the fixed control lines 4810a, 4810b, and 4810c, respectively may be different. If the opening size of the orifice 4812 is large, the flow rate of the passing supercritical fluid is high. If the opening size of the orifice 4812 is small, the flow rate of the passing supercritical fluid is low.

The variable control line 4814 is provided with a flow rate control valve 4816a of which an opening degree may be controlled and an opening/closing valve 4816b. Because the size of the opening of the orifice 4812 of the fixed control line 4810 is preset, it is impossible to achieve a targeted flow rate of the supercritical fluid by using only the fixed control line 4810. Accordingly, a flow rate that is the same as a finally targeted flow rate may be achieved by using the variable control line 4814 as well as the fixed control line 4810. The flow rate of the supercritical fluid that is supplied to the rear supply line 4890 after passing through the variable control line 4814 may be controlled by using the flow rate control valve 4816a.

The controller 7000 controls the flow rate control unit 5000. The controller 7000 controls the valves of the flow rate control unit 5000.

Figure 6:
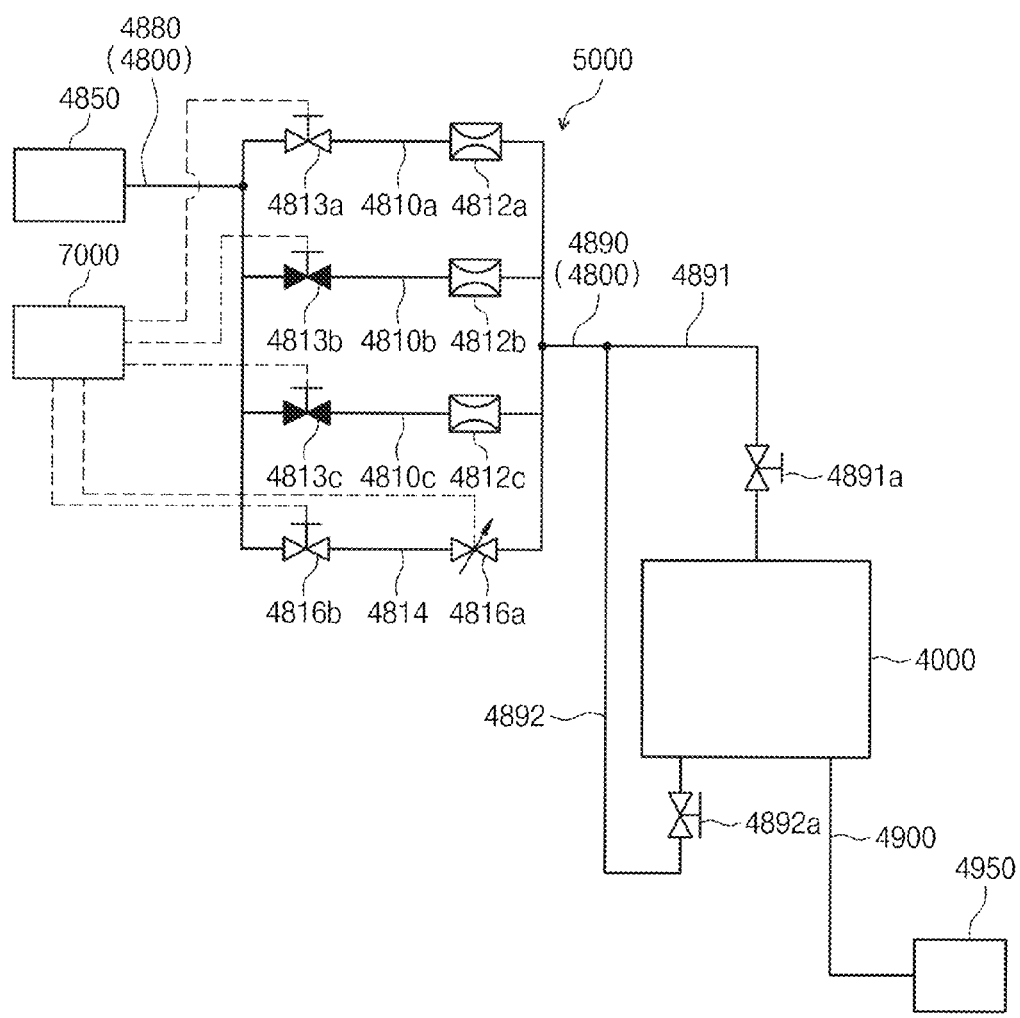
FIGS. 6 through 8 are views illustrating examples of adjusting a flow rate of a supercritical fluid supplied to a chamber by controlling a flow rate control unit in the substrate treating apparatus of FIG. 5.
Figure 7:
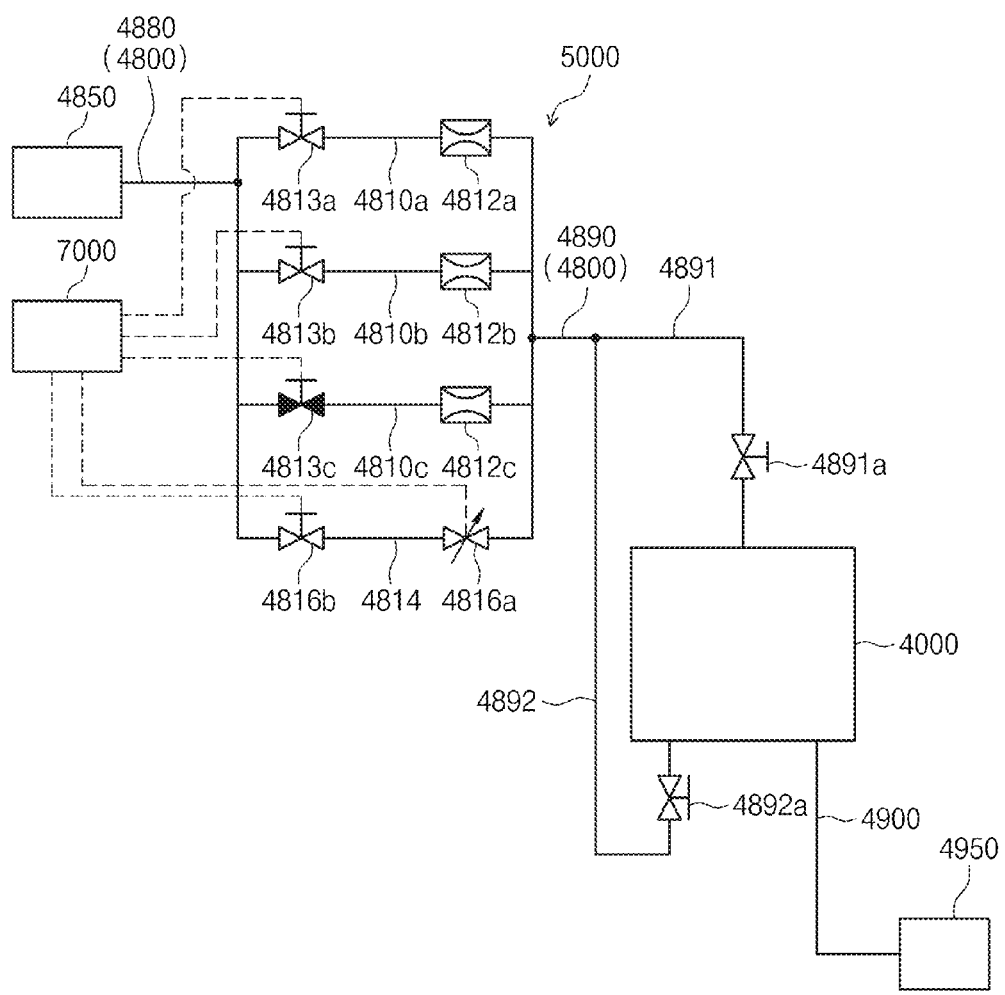
Figure 8:
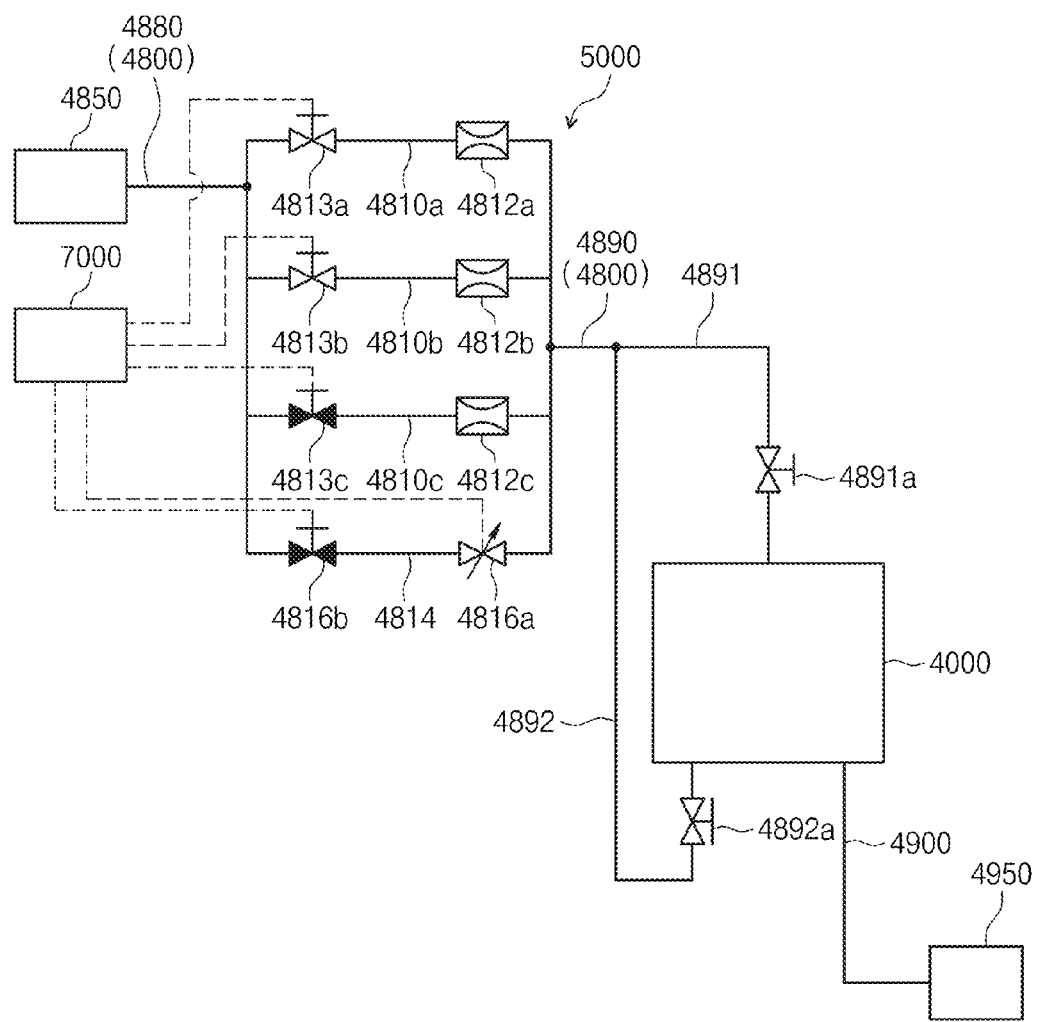

FIGS. 6 through 8 illustrate modified examples in which the controller controls the flow rate control unit to control a flow rate of a supercritical fluid supplied to a chamber. The shadowed parts in the valves mean that the valves are closed. The valves in the fixed control line 4810 and the variable control line 4814 are opened and closed to allow the supercritical fluid to flow through the lines or prevent the supercritical fluid from flowing through the lines. The controller 7000 may control a valve that controls a flow rate of the variable control line 4814. FIGS. 6 through 8 illustrate only parts of the modified examples, the number of the fixed control lines 4810 or the variable control lines 4814 may vary, and the valves may be variously opened and closed to control the flow rates of the supercritical fluid.

Figure 11:
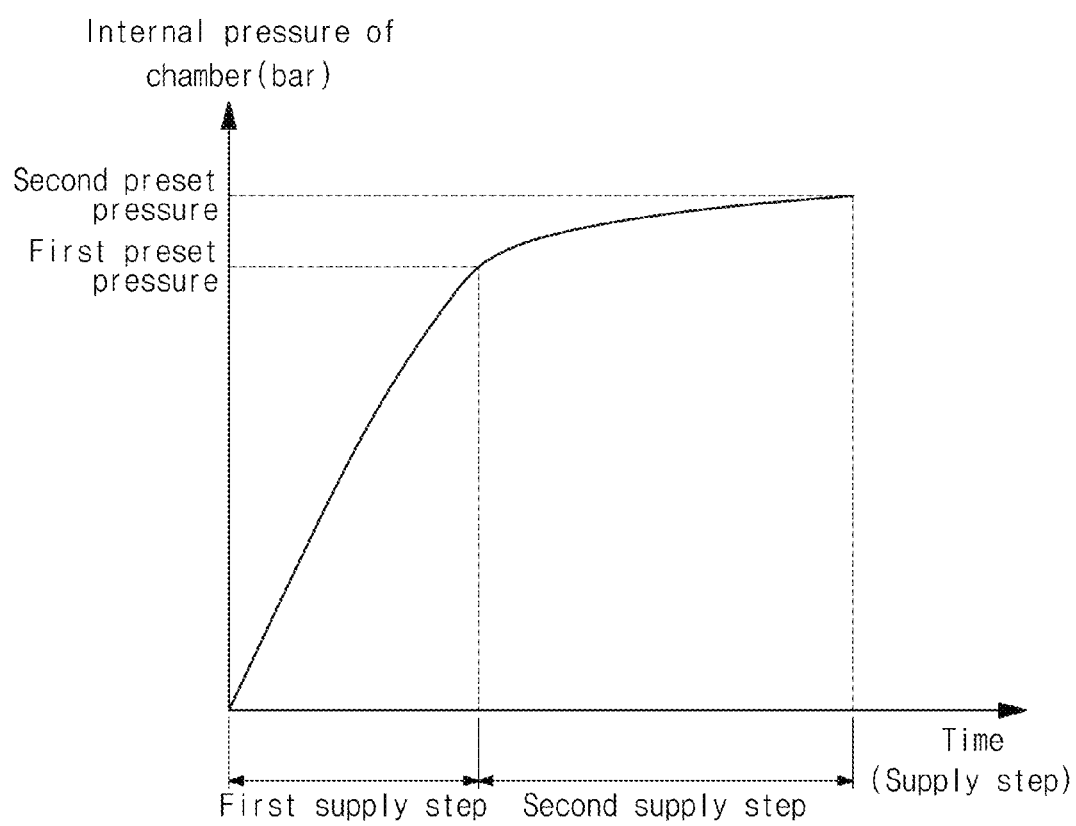
FIGS. 11 and 12 are graphs illustrating changes in the pressure of the interior of the chamber over time in a supply step according to an example and FIGS. 13 through 15 are graphs illustrating changes in the pressure of the interior of the chamber over time in a supply step according to a modified example.
Figure 12:
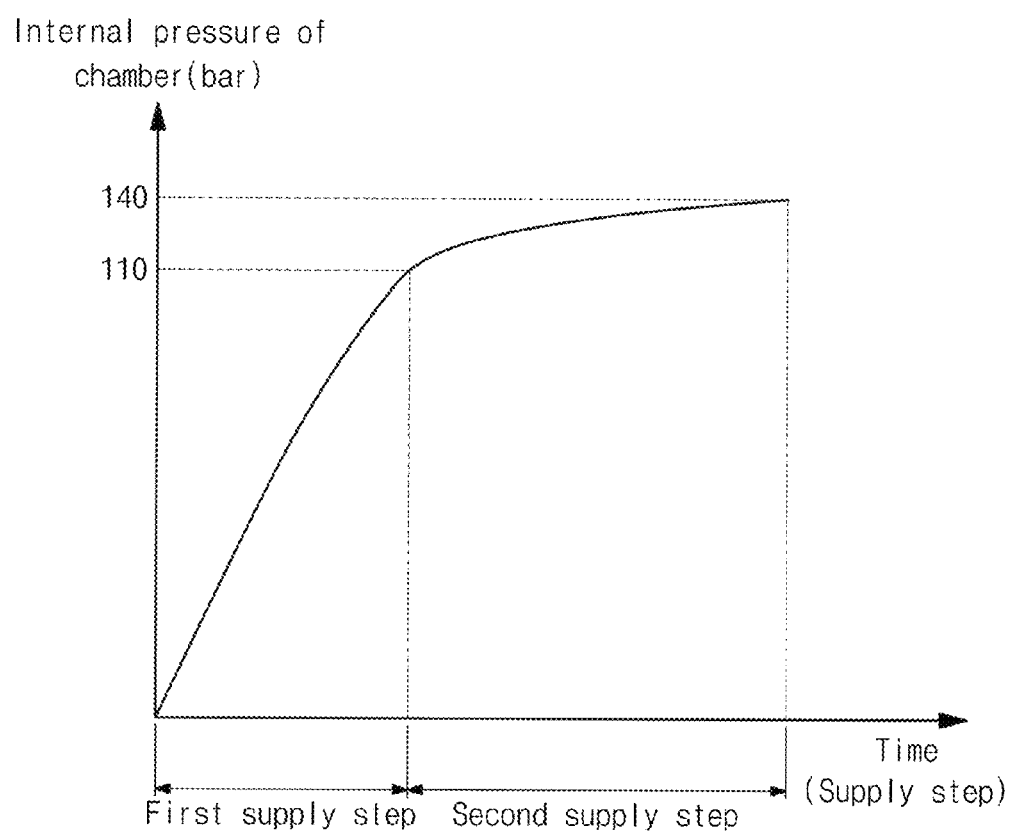

FIGS. 11 and 12 are graphs illustrating changes in the pressure of the interior of the chamber over time in a supply step according to an example. The pressure change of the interior of the chamber may vary according to the flow rate of the supercritical fluid. If a large amount of supercritical fluid is supplied, the pressure change of the interior of the chamber is large. In contrast, if a small amount of supercritical fluid is supplied, the pressure change of the interior of the chamber is small. Hereinafter, a flow rate of the supercritical fluid and the pressure of the interior of the chamber over time (a process step) will be described with reference to FIGS. 11 and 12.

The controller 7000 supplies the supercritical fluid to the chamber 4000 at a first flow rate until the pressure of the interior of the chamber 4000 reaches the first preset pressure. Further, the supercritical fluid is supplied to the chamber 4000 at a second flow rate until the internal pressure of the chamber 4000 reaches a second preset pressure after it reaches the first preset pressure. The first flow rate is higher than the second flow rate.

The first preset pressure may be not less than a critical pressure of the supercritical fluid.

First, the first preset pressure may be a critical pressure of the supercritical fluid. When the supercritical fluid is carbon dioxide, the first preset pressure may be a critical pressure of carbon dioxide of 73.8 bar. If the first preset pressure is lower than 73.8 bar, carbon dioxide filled in the chamber 4000 is present in a gaseous state instead of a supercritical state. If the flow rate of the supercritical fluid becomes lower before the pressure of the chamber becomes 73.8 bar, a liquefied organic solvent, such as isopropyl alcohol, which is present in the substrate is not sufficiently mixed with the gaseous carbon dioxide. Accordingly, because carbon dioxide is not sufficiently substituted by isopropyl alcohol, the efficiency of the dry process deteriorates.

Next, the first preset pressure may be higher than a critical pressure of the supercritical fluid. If the supercritical fluid is carbon dioxide, the critical pressure of the supercritical fluid may be higher than 73.8 bar. The first preset pressure may be not less than 100 bar and not more than 120 bar. The first preset pressure may be 110 bar. A critical pressure of a mixture fluid in which carbon dioxide and isopropyl alcohol are mixed is not less than 100 bar and not more than 120 bar. Because the mixture fluid is accumulated, the substitution of carbon dioxide by isopropyl alcohol is not sufficiently made over time. Accordingly, the first preset pressure may be not less than 100 bar and not more than 120 bar such that the substitution of carbon dioxide by isopropyl alcohol is sufficiently made.

Further, if the supercritical fluid is carbon dioxide, the first preset pressure may be not more than 120 bar. The first preset pressure may be 110 bar. If carbon dioxide is supplied at the first flow rate while the pressure exceeds 120 bar, particles are generated in the substrate, causing process defects and making the drying efficiencies for areas of the substrate different. After the first preset pressure is reached, a large amount of carbon dioxide is present in the chamber 4000 in advance. Accordingly, because the density of carbon dioxide in the chamber 4000 is high then, carbon dioxide pushes out isopropyl alcohol so that the substitution efficiency of carbon dioxide and isopropyl alcohol deteriorates. Accordingly, the drying efficiencies for areas of the substrate become different.

After the internal pressure of the chamber 4000 reaches the first preset pressure, the controller 7000 controls the flow rate control unit 5000 such that the supercritical fluid is supplied at the second preset pressure until the internal pressure of the chamber 4000 reaches the second preset pressure. The second preset pressure is a process pressure at which a drying process is performed in the chamber 4000. For example, the second preset pressure may be 130 bar to 160 bar. The second preset pressure may be 140 bar. In the supply step, the supercritical fluid is supplied until the pressure in the chamber 4000 reaches 140 bar.

A step of supplying the supercritical fluid to the chamber 400 is referred to as a supply step. The supply step includes a first supply step S100 and a second supply step S200. The first supply step S100 is a process of supplying the supercritical fluid at a first flow rate until the pressure reaches a first preset pressure. The second supply step S200 is a process of supplying the supercritical fluid at a second flow rate until the pressure reaches a second preset pressure.

The first flow rate is higher than the second flow rate. For example, the first flow rate may be 1.0 kg/min to 2.0 kg/min. The first flow rate may be 1.2 kg/min. The second flow rate may be 0.5 kg/min to 1.0 kg/min. The second flow rate may be 0.7 kg/min. In the first supply step S100 of supplying the supercritical fluid at the first flow rate, the supercritical fluid is filled in the chamber 4000 relatively rapidly. In the second supply step S200 of supplying the supercritical fluid at the second flow rate, the supercritical fluid is filled in the chamber 4000 relatively slowly.

According to the related art, because the chamber 4000 is filled with the supercritical fluid at not more than the second flow rate while the supercritical fluid is supplied, much time is consumed. However, according to the inventive concept, because the supercritical fluid is supplied at the first flow rate that is higher than the second flow rate before the pressure reaches the first preset pressure, process time may be shortened. Further, the above-described interruption member 4600 may prevent a damage to the substrate. Further, in the first supply step S100 and the second supply step S200, the supercritical fluid may be supplied into the chamber 4000 through a lower portion of the chamber 4000 only along the second rear supply line 4892.

Figure 13:
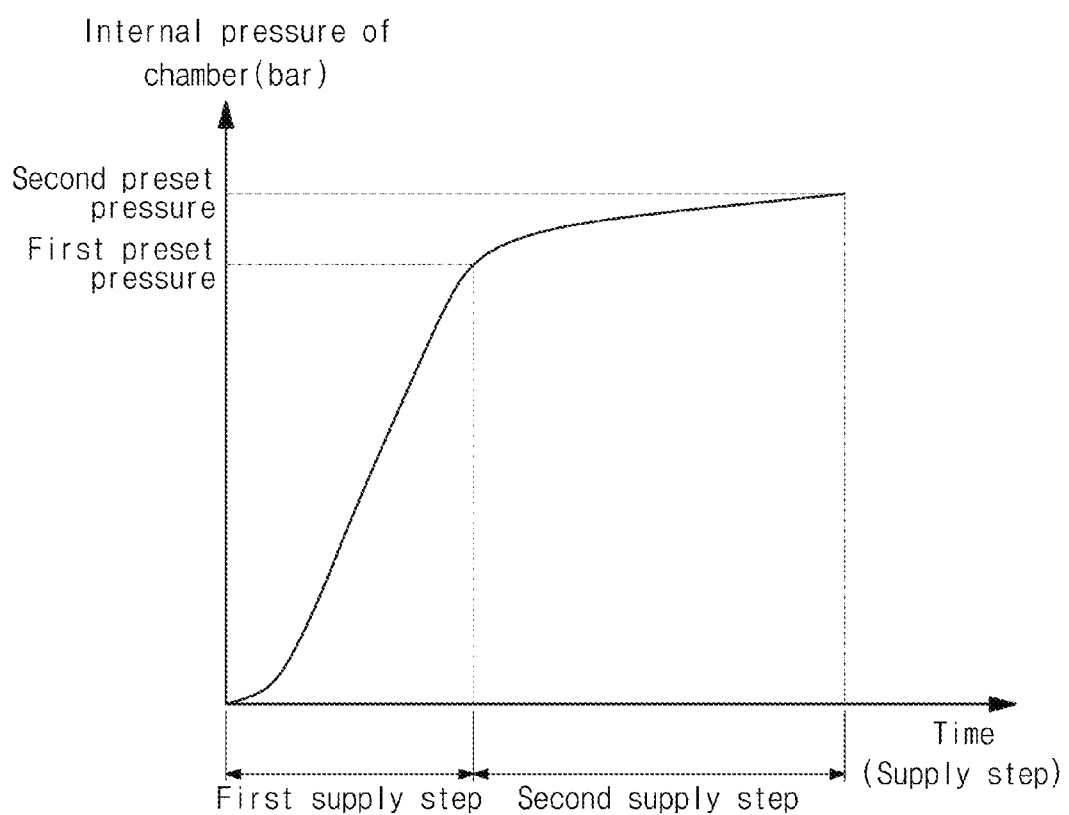
Figure 14:
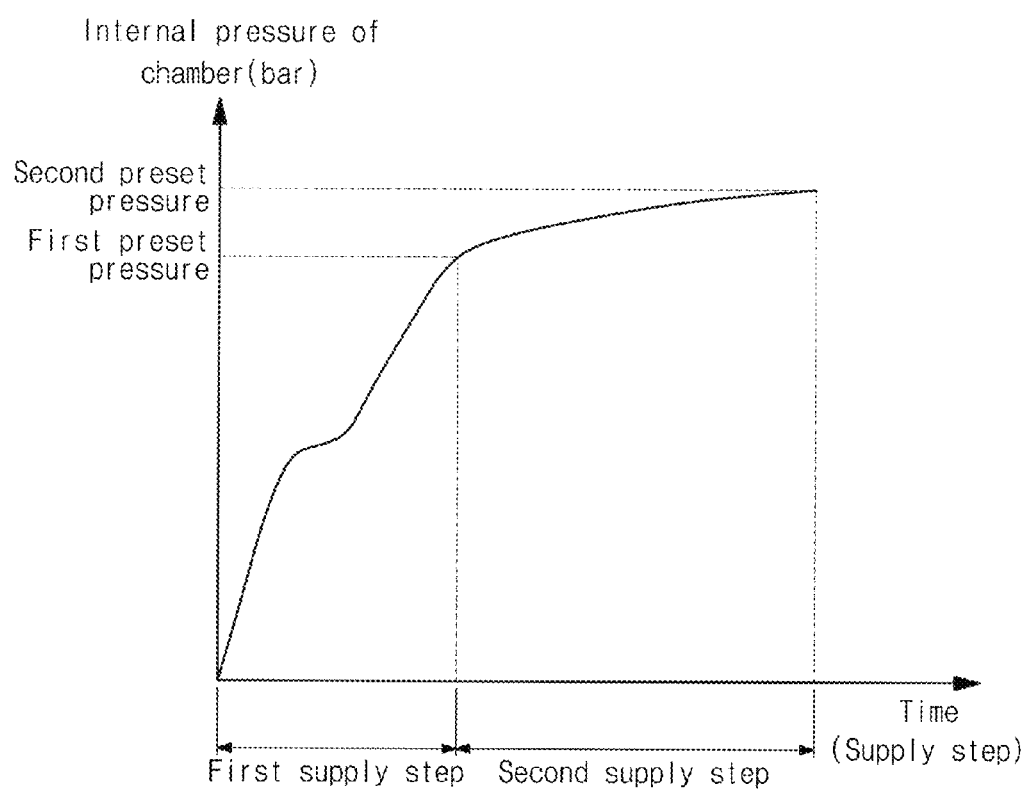
Figure 15:
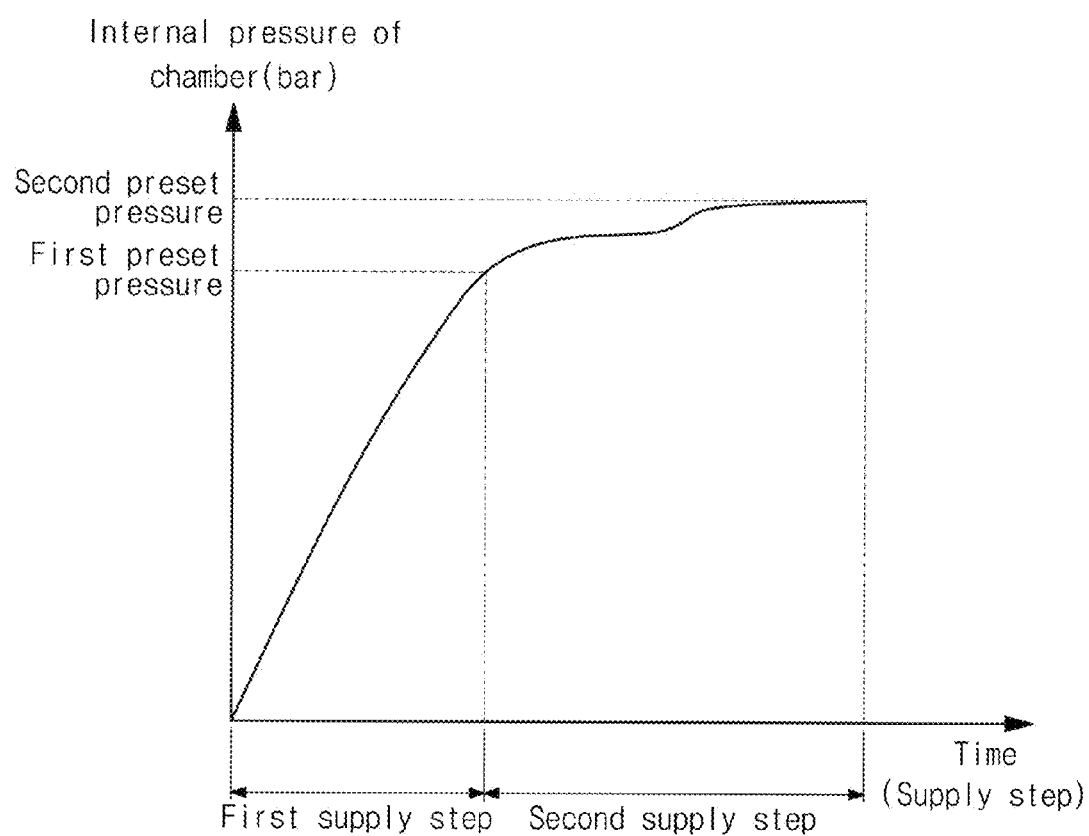

The controller 7000 may vary the first flow rate over time in the first supply step S100. The controller 7000 may vary the second flow rate over time in the second supply step S200. FIGS. 13 to 15 are graphs illustrating changes in the pressure of the interior of the chamber 4000 over time in a supply step according to a modified example.

Referring to FIGS. 13 and 14, the first flow rate is not constant and may vary over time. Referring to FIG. 15, the second flow rate is not constant and may vary over time. Although FIGS. 13 and 14 illustrate that the flow rates vary once, the inventive concept is not limited thereto and the flow rates may vary a plurality of times. Meanwhile, an average value for the first flow rate may be larger than an average value for the second flow rate.

Figure 9:
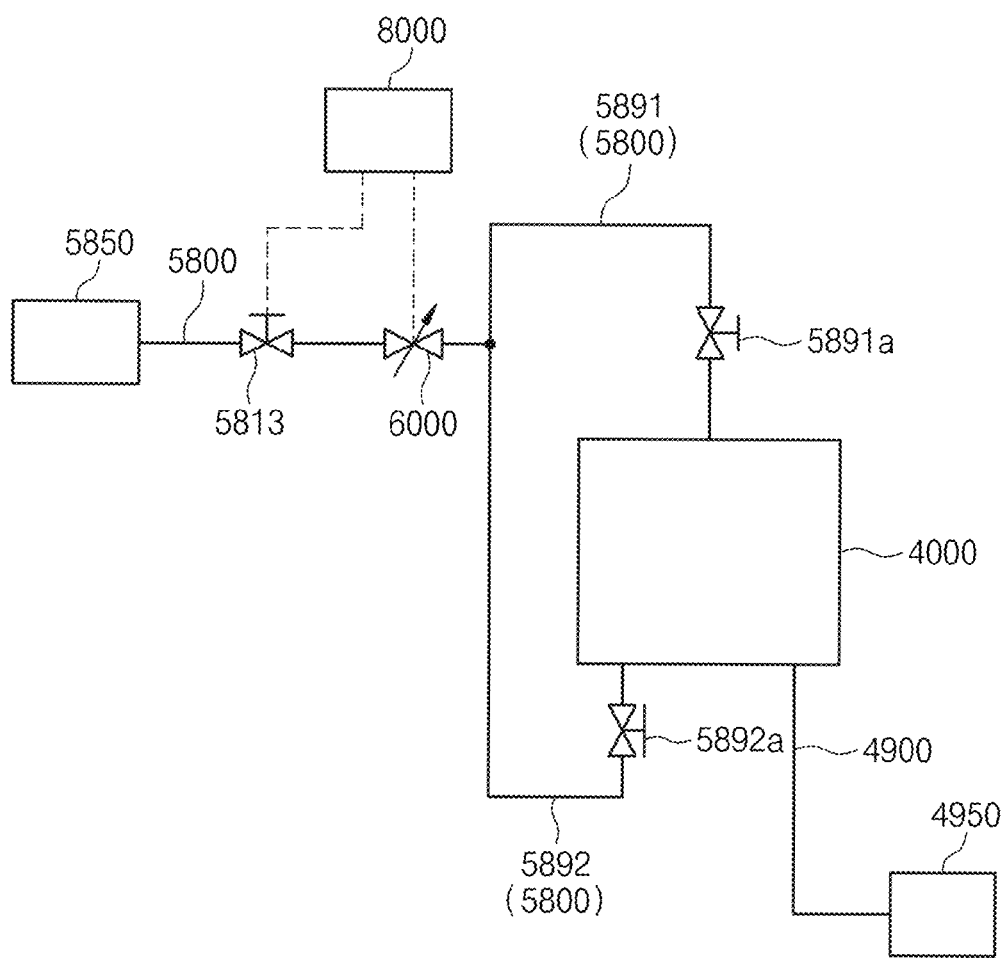
FIG. 9 is a view illustrating a second embodiment of the substrate treating apparatus of FIG. 2.

FIG. 9 illustrates a substrate treating apparatus according to a second embodiment of the inventive concept.

Referring to FIG. 9, the flow rate control unit 5000 may include a regulator. 6000 The regulator 6000 is provided on a supply line. The regulator 6000 controls a flow rate of a supercritical fluid. The regulator 6000 may control flow rate while the supercritical fluid is supplied. The regulator 6000 may measure an internal pressure of the chamber 4000 to properly vary the flow rate of the supercritical fluid over time even while the process is performed. In detail, as well as in the supply step, even in the substrate treating step S300, the supercritical fluid is supplied and exhausted, and the flow rate of the supercritical fluid may be controlled even while the process is performed.

The controller 8000 controls the regulator 6000 provided on the supply line 5800. The controller 8000 controls an opening/closing valve 5813 provided on the supply line 5800. The regulator 6000 supplies the supercritical fluid to the chamber 4000 at a first flow rate until the pressure of the interior of the chamber 4000 reaches the first preset pressure. The regulator 6000 supplies the supercritical fluid to the chamber 4000 at the second flow rate until the internal pressure of the chamber 4000 reaches the first preset pressure. After the internal pressure of the chamber 4000 reaches the second preset pressure, the supply of the supercritical fluid is stopped. The first flow rate is higher than the second flow rate. The description of the first preset pressure, the second preset pressure, the first flow rate, and the second flow rate is as described in the first embodiment.

Although not illustrated, the orifice, the valve, and the regulator may be provided together. Further, only one of them may be provided, or only two of them may be provided. The flow rate of the supercritical fluid may be controlled in response to the first flow rate and the second flow rate that are set by controlling the valves in combination of the orifice, the valve, and the regulator. This is similar to those as illustrated in FIGS. 6 through 8.

Referring back to FIG. 5, the process fluid that processes the substrate in the chamber 4000 is exhausted through the exhaust line 4900. The exhausted process fluid flows to the supercritical fluid recycling unit 4950. An exhaust valve 4910 is provided in the exhaust line 4900. The exhaust step S400 is performed by opening and closing the exhaust valve 4910.

The supercritical fluid is supplied into the housing 4100 of the chamber 4000 through the supply line 4800, and is exhausted to the outside of the housing 4100 of the chamber 4000 through the exhaust line 4900.

Hereinafter, a substrate treating method according to the inventive concept will be described by using the aforementioned substrate treating apparatus 100. Meanwhile, because the above description is only for convenience of description, the substrate drying method may be performed by the same or similar apparatus, in addition to the aforementioned substrate treating apparatus 100.

Figure 10:
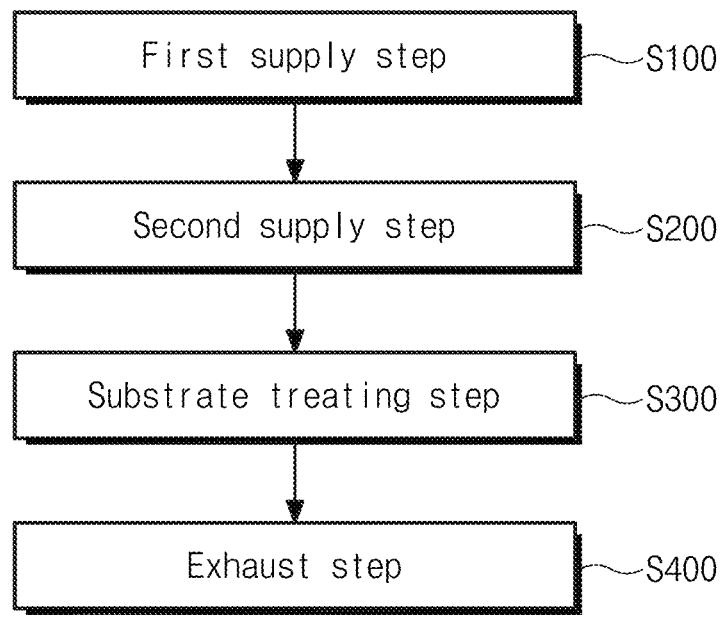
FIG. 10 is a flowchart sequentially illustrating a substrate treating method according to the inventive concept.

Referring to FIG. 10, the substrate treating method according to the inventive concept includes a supply step S100 and S200, a substrate treating step S300, and an exhaust step S400. The supply step is a step of supplying the supercritical fluid into the chamber 4000 before the substrate is treated. The substrate treating step S300 is a step of drying the substrate by using the supercritical fluid after the supply step. The exhaust step S400 is a step of exhausting the supercritical fluid that has treated the substrate.

The supply step includes a first supply step S100 and a second supply step S200. In the first supply step S100, the supercritical fluid is supplied into the chamber 4000 at a first flow rate until the internal pressure of the chamber 4000 reaches a first preset pressure. In the second supply step S200, the supercritical fluid is supplied into the chamber 4000 at a second flow rate until the internal pressure of the chamber 4000 reaches a second preset pressure. The first flow rate is higher than the second flow rate. In this way, in the supply step, the flow rate of the supercritical fluid varies. The description of the first preset pressure, the first flow rate, the second preset pressure, and the second flow rate is as described in the substrate treating apparatus according to the inventive concept.

The flow rate of the supercritical fluid is controlled by one or more fixed control lines provided with orifices 4812 having different opening sizes, a variable control line 4814 provided with a valve for controlling flow rate, and a regulator 6000. In the method for treating a substrate according to the inventive concept, the flow rate of the supercritical fluid may be controlled by the fixed control lines 4810, the variable control line 4814, and the regulator 6000. Valves are provided in the fixed control lines 4810, the variable control line 4814, and the supply line provided with the regulator 6000. The flow rate of the supercritical fluid provided to the chamber 4000 is controlled by opening and closing the valves. The description of the fixed control lines 4810, the variable control line 4814, and the regulator 6000 is as described above.

According to an embodiment of the inventive concept, process time may be shortened and process efficiency may be improved by promptly supplying a supercritical fluid into a chamber.

The effects of the inventive concept are not limited to the above-mentioned effects, and the unmentioned effects can be clearly understood by those skilled in the art to which the inventive concept pertains from the specification and the accompanying drawings.

The above description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A method for treating a substrate, in which a supercritical fluid is supplied into a chamber, in which the substrate is carried, to treat the substrate, the method comprising:

a supply step of supplying the supercritical fluid into the chamber until a pressure of an interior of the chamber reaches a preset pressure; and a substrate treating step of performing a supercritical process while repeating supply and exhaust of the supercritical fluid into and out of the interior of the chamber after the supply step, wherein a flow rate of the supercritical fluid supplied into the chamber in the supply step is variable, and wherein the flow rate of the supercritical fluid supplied in the supply step is varied by one or more fixed control lines that are provided with orifices having different opening sizes.

2. The method of claim 1, wherein the flow rate of the supercritical fluid supplied in the supply step is varied by a variable control line provided with a valve that is connected in parallel to the fixed control line to control flow rate and the fixed control line.

3. The method of claim 1, wherein the flow rate of the supercritical fluid supplied in the supply step is varied by a regulator that is provided on a supply line through which the supercritical fluid is supplied.

4. The method of claim 1, wherein the supply step comprises:
a first supply step of supplying the supercritical fluid into the chamber until a pressure of the interior of the chamber reaches a first preset pressure; and
a second supply step of supplying the supercritical fluid into the interior of the chamber until the pressure of the interior of the chamber reaches a second preset pressure after the first supply step, and
wherein a first flow rate of the supercritical fluid supplied in the first supply step is higher than a second flow rate of the supercritical fluid supplied in the second supply step.

5. The method of claim 4, wherein at least one of the first flow rate and the second flow rate varies over time.

6. The method of claim 4, wherein the first preset pressure is a critical pressure of the supercritical fluid.

7. The method of claim 4, wherein the supercritical fluid is carbon dioxide, and the first preset pressure is 100 bar to 120 bar.

8. A method for treating a substrate, in which a supercritical fluid is supplied into a chamber, in which the substrate is carried, to treat the substrate, the method comprising:
a supply step of supplying the supercritical fluid into the chamber until a pressure of the interior of the chamber reaches a preset pressure; and
a substrate treating step of performing a supercritical process in the interior of the chamber after the supply step,
wherein a flow rate of the supercritical fluid supplied into the chamber in the supply step is variable, and
wherein the flow rate of the supercritical fluid supplied in the supply step is varied by one or more fixed control lines that are provided with orifices having different opening sizes.

9. The method of claim 8, wherein the flow rate of the supercritical fluid supplied in the supply step is varied by a variable control line provided with a valve that is connected in parallel to the fixed control line to control flow rate and the fixed control line.

10. The method of claim 8, wherein the supply step comprises:
a first supply step of supplying the supercritical fluid into the chamber until a pressure of the interior of the chamber reaches a first preset pressure; and
a second supply step of supplying the supercritical fluid into the interior of the chamber until the pressure of the interior of the chamber reaches a second preset pressure after the first supply step, and
wherein a first flow rate of the supercritical fluid supplied in the first supply step is higher than a second flow rate of the supercritical fluid supplied in the second supply step.

11. The method of claim 10, wherein at least one of the first flow rate and the second flow rate varies over time.

12. The method of claim 10, wherein the first preset pressure is a critical pressure of the supercritical fluid.

* * * * *